United States Patent [19]

Stutz et al.

[11] 4,281,284

[45] Jul. 28, 1981

[54] METHOD AND APPARATUS FOR ELECTRICALLY CONTACTING A MATERIAL SPECIMEN TO THE CONDUCTORS OF A COAXIAL CABLE

[75] Inventors: David E. Stutz; Thomas Atterbury; William F. Scharenberg, Jr., all of Columbus, Ohio

[73] Assignee: Transmet Corporation, Columbus, Ohio

[21] Appl. No.: 97,890

[22] Filed: Nov. 26, 1979

[51] Int. Cl.³ .......................................... G01R 27/04
[52] U.S. Cl. ................................... 324/58 A; 324/54
[58] Field of Search ............ 324/58 A, 58 R, 58.5 A, 324/54, 51

[56] References Cited

U.S. PATENT DOCUMENTS

| | | | |
|---|---|---|---|
| 2,747,160 | 5/1956 | Bird | 324/58 A |
| 2,988,740 | 6/1961 | Albanese | 324/58 A X |
| 3,462,682 | 8/1969 | Barnett et al. | 324/54 |
| 3,839,672 | 10/1974 | Anderson | 324/58 A |

Primary Examiner—Stanley T. Krawczewicz
Attorney, Agent, or Firm—Burns, Doane, Swecker & Mathis

[57] ABSTRACT

A specimen holder has flexible walls to provide good electrical contact between a material to be tested for its electrical properties and the conductors of a coaxial cable. The walls of the specimen holder are tubular in shape and coaxial and have a plurality of longitudinal slots spaced therearound to provide strips which are flexible in the radial direction. The walls are permanently distorted in a radial direction to urge them towards each other and into spring-like contact with an annular material specimen inserted between them. The specimen holder is particularly suited for measuring the electromagnetic shielding effectiveness of materials.

12 Claims, 3 Drawing Figures

METHOD AND APPARATUS FOR ELECTRICALLY CONTACTING A MATERIAL SPECIMEN TO THE CONDUCTORS OF A COAXIAL CABLE

BACKGROUND OF THE INVENTION

The present invention relates in general to the measurement of electrical properties of a material, and more particularly to a method and apparatus for holding a specimen of a material to be tested in good electrical contact with the conductors of a coaxial cable in an electrical property measurement system.

With the increasing use of electromagnetic devices of all types in modern times, there is an accompanying increase of electromagnetic energy which is radiated from these devices into the environment. Depending upon its frequency and power level, this radiation is generally undesirable since it can adversely effect the operation of electronic components and electromagnetic devices other than that from which it is radiated. Therefore, it has become necessary to shield many electrical, electromagnetic and electronic devices, such as computers, computer terminals and microprocessors, for example, to protect them from incoming radiation and to prevent outgoing radiation.

Various means have been used to shield electrical and electronic devices by reducing the energy level of incoming and outgoing radiation. Metallic enclosures have proven to be the most effective device for shielding such devices from electromagnetic radiation since almost all types of metallic enclosures are thick enough to provide adequate shielding by both reflection and absorption of incident electromagnetic energy. However, the use of plastic enclosures has become more widespread in recent years due to their lower cost and weight as well as the ease with which they can be fabricated. Plastic materials do not provide electromagnetic shielding in their usual form and therefore must be modified to provide such an effect.

One conventional method for rendering a plastic enclosure effective to shield electromagnetic radiation is to apply a metallic coating to the plastic, thereby enabling the plastic enclosure to function in the same manner as a metallic enclosure. Another conventional method for rendering a plastic enclosure effective to shield electromagnetic radiation is through the use of conductive composites. The conductive composites are made by incorporating a conductive filler in a resin. The conductive filler can be carbon particles or metallic particles such as aluminum flake or aluminum fibers, for example. Both coated plastics and conductive composites have adequate electromagnetic shielding capabilities to enable them to be utilized in a variety of applications.

In the manufacture of plastics which have been treated to give them electromagnetic shielding capabilities, it is necessary to measure the shielding effectiveness of the material. Shielding effectiveness (SE) is generally defined as the ratio of the power which is incident on a material to the power which is transmitted through the material and is usually expressed in units of decibels, i.e., $$SE = 10 \log (P_i/P_t) \text{ in } dB.$$

In the past, shielding effectiveness has been measured by placing a flat panel of the material to be tested across an opening in a large room which is totally enclosed by steel walls so that no electromagnetic radiation can escape other than through the panel. A transmitter is placed in the room and a receiver is located outside the room and the power level of the signal received at the receiver is measured without the panel across the opening in the room and subsequently with the panel in place across the opening. The ratio of the two measured signals provides an indication of the shielding effectiveness of the panel of material over a relatively broad range of frequencies. If the measurement of shielding effectiveness is limited by space or cost considerations, essentially the same procedure can be carried out using a small box in place of the large room.

These prior art methods have a number of limitations which seriously effect the accuracy of the data obtained during the measurement. In addition to the cost of constructing a large shielded room and the use of large material specimens, these limitations include the effects on the measurement of the resonance of the room at critical wave lengths, the resonance of the aperture in the room and the frequency response characteristics of the transmitter and receiver antennas. It has been found that these limitations are substantial enough to produce different sets of data from different measurement facilities even though the same material specimen is being measured at each facility.

More recently, a method of measuring the shielding effectiveness of material specimens with the use of a coaxial conductor has been developed to overcome the limitations associated with the previously discussed method of measuring shielding effectiveness. In this method, the material to be tested is placed in electrical contact with the conductors of a coaxial cable. The shielding effectiveness is determined by a standard substitution method conventionally used to measure insertion loss of various components at different radio frequencies, wherein the power level of a signal transmitted from one end of the coaxial cable and received at the other end is first measured without the material in contact with the conductors of the cable and then with the material in place in the measurement system. The amount of attentuation of the transmitted signal introduced by the material specimen is detected and provides an indication of the shielding effectiveness of the material.

This coaxial line method of measurement has several advantages over the prior method discussed previously. Among other features, it is capable of functioning effectively over a broad band of frequencies and it operates in the transverse electromagnetic mode, i.e., the same mode at which energy is propagated in free space, to thereby render an effective indication of the shielding effectiveness of the tested material in a practical application. The electromagnetic signal used in the measurement of the effectiveness is totally enclosed within the coaxial line and therefore leakage is not a significant factor in the measured data. Resonances which may be due to room size, antenna characteristics and the reflections of surrounding structures are eliminated. In addition, the coaxial cable enables relatively small specimens of the material to be used in the measurement system.

One problem associated with the coaxial line method of measuring shielding effectiveness is the difficulty of attaining good electrical contact between the material specimen and the inner and outer conductors of the coaxial line. In order to achieve good electrical contact, it is necessary to have good physical contact. If good physical contact is not obtained, there will be a gap between the material specimen and the walls of the coaxial transmission line, which will introduce a capacitive reactance into the line in series with the predominantly resistive load of the shielding material. This capacitive reactance can seriously effect the accuracy of data which is obtained during the shielding effectiveness measurement. It is not economically feasible to machine a specimen of material to the precise dimensions necessary to achieve good electrical and physical contact between the material and the conductors of a standard coaxial cable.

One device for use in the measurement of shielding effectiveness in a coaxial line is illustrated in U.S. Pat. No. 2,747,160, issued to Byrd. The Byrd patent discloses a measuring device for placing wire insulation, such as that found on ignition wires, in contact with the conductors of a coaxial cable to enable the shielding effectiveness of the wire insulation to be measured. The device disclosed in the patent can only be used to measure the effectiveness of wire insulation or other tubular materials, and is not suitable for use in measuring the shielding effectiveness of a specimen from a sheet of material. In addition, the dimensions of the wire insulation and the device for holding the insulation must be within very small tolerance ranges in order to achieve good electrical contact between the coaxial cable and the specimen of insulation, resulting in a substantial cost factor in the measurement of shielding effectiveness.

It is therefore an object of the present invention to provide a novel method and apparatus for holding a specimen of material in good electrical contact with the conductors of a coaxial cable.

It is another object of the present invention to increase the applicability of the coaxial line method of measuring shielding effectiveness by providing a novel specimen holder which can accommodate planar specimens of a material to be tested.

It is a further object of the present invention to provide a novel method and apparatus for testing the shielding effectiveness of material specimens.

BRIEF DESCRIPTION OF THE DRAWINGS

These, as well as other objects and advantages of the present invention, will be more fully appreciated upon a perusal of the following detailed description of a preferred embodiment of the invention in conjunction with the accompanying drawings in which.

DETAILED DESCRIPTION

In order to more fully elucidate upon various objects and advantages of the present invention, it will be described in terms of the preferred embodiment thereof which relates to the measurement of shielding effectiveness of a material. However, it will be appreciated by those of ordinary skill in the art that the invention can be utilized in the measurement of other properties of materials, and therefore the following description is intended as illustrative and in no way limitative.

Figure 1:
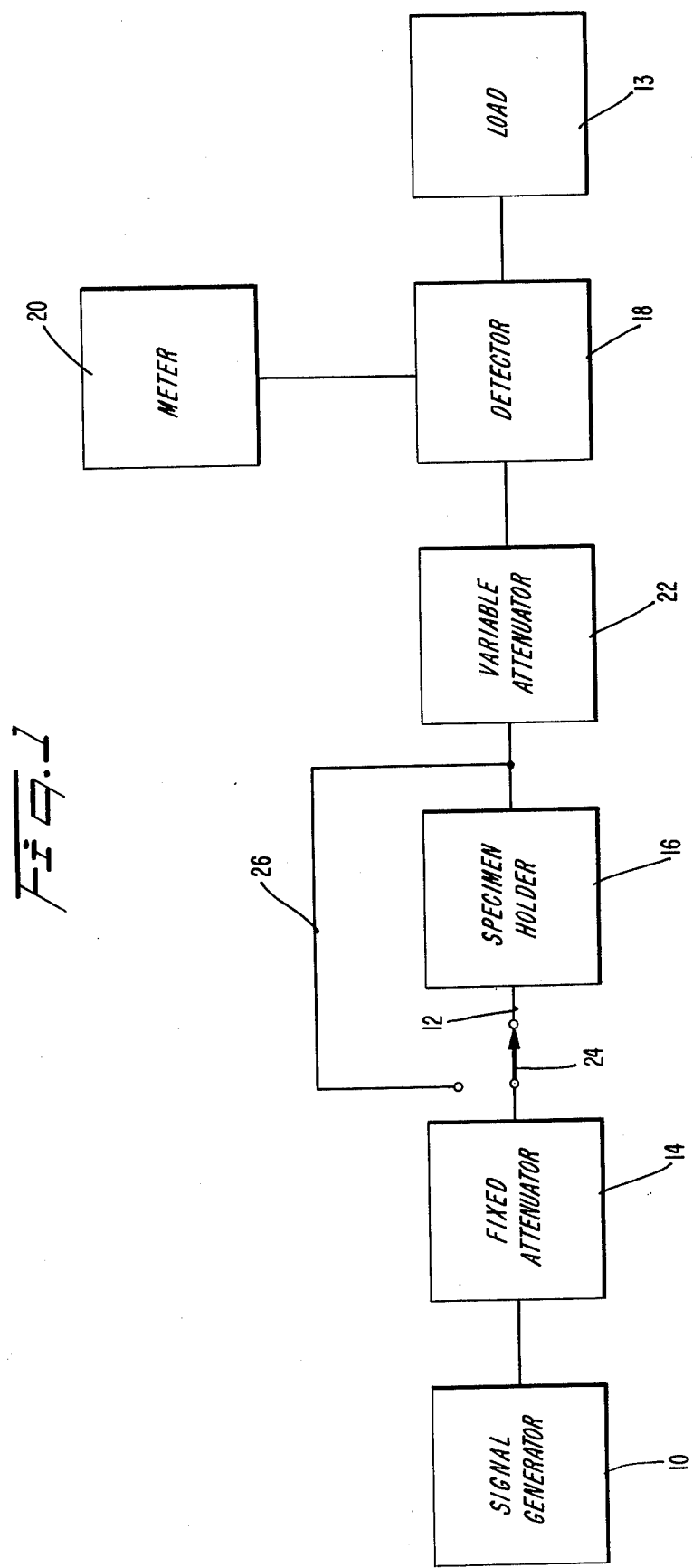
FIG. 1 is a block diagram of a circuit for measuring the shielding effectiveness of a material specimen.

Referring now to FIG. 1, a circuit incorporating the coaxial line method of measuring shield effectiveness is illustrated in block diagram form. A signal generator 10 produces an output signal to be transmitted by the coaxial cable 12 of the measurement circuit. The signal generator 10 is preferably capable of producing output signals over a broad range of the radio frequency band, to thereby enable the specimen to be tested at a number of different commonly encountered frequencies. The output signal of the signal generator 10 is passed through a fixed attenuator 14, which provides a predetermined reduction in the power level of the generator output signal without any appreciable distortion thereof. The function of the fixed attenuator 14 is to prevent frequency changes in the signal generator when a specimen to be tested for its electrical properties is inserted in the circuit.

A specimen holder 16 is inserted in series with the coaxial cable 12. The holder 16 places the specimen of material to be tested in shunt across the two conductors of the coaxial cable 12. The attentuated output signal from the signal generator 10 is received at the input terminals of the specimen holder 16 and is attenuated an amount determined by the material in the holder. The amount of attenuation produced by the specimen in the holder 16 can be measured by measuring the ratio of the electric field strength which appears at the output terminal of the specimen holder 16 with and without the specimen in place.

The field strength of the output signal from the specimen holder 16 is measured by means of a suitable conventional detector 18. The measured strength of the signal can be displayed on a suitable meter 20. By way of example, the detector 18 can be a series connection of a meter and a diode which is placed in shunt across the conductors of the coaxial cable 12. The meter 20 can be a standing wave ratio (SWR) meter which provides an indication of the ratio of the maximum and the minimum values of power of the signal appearing across the diode forming the detector 18. It will be appreciated that other electronic components, such as a thermistor, for example, can be used in place of a diode to form the detector 18. In addition, other suitable conventional devices for detecting and indicating the field strength of a radio frequency signal can be utilized.

A variable attenuator 22 is preferably connected in series between the output terminals of the specimen holder 16 and the detector 18. Since the indication of field strength provided by the detector 18 and the meter 20 may not be accurate for all power levels, it is preferable to adjust the power level of the output signal from the specimen holder 16 to a suitable predetermined level on the meter 20 for each measurement. The amount of attenuation introduced by a specimen can then be determined by the degree to which the variable attenuator 22 must be adjusted to bring the reading on the meter 20 to the predetermined level.

In the operation of the circuit illustrated in FIG. 1, the signal generator 10 is energized to produce an output signal at a predetermined frequency. This output signal, after passing through the fixed attenuator 14, is first presented directly to the input terminals of the variable attenuator 22 without having the specimen 16 in the circuit. This step can be accomplished, for example, by means of a switch 24 which disconnects the specimen holder 16 from the fixed attenuator 14 and directly connects the output terminals of the fixed attenuator 14 to the input terminals of the variable attenuator 22 by means of a jumper cable 26. Alternatively, the coaxial cable 12 can have mating coaxial connectors which are directly connected to each other without the specimen holder 16 being inserted therebetween, to thereby eliminate any effects which the switch 24 may have on the strength of the transmitted signal. The variable attenuator 22 is then adjusted to bring the field strength reading on the meter 20 to a suitable predetermined level, and the value to which the variable attenuator is set is recorded.

The specimen holder 16 is then inserted in series between the fixed attenuator 14 and the variable attenuator 22. This can be accomplished by switching the position of the movable contact of the switch 24, or by disconnecting the two mating connectors of the coaxial cable 12 and connecting them respectively to the input and output terminals of the specimen holder 16. The variable attenuator 22 is then adjusted to bring the reading on the meter 20 to the same predetermined level as that which was obtained previously. The value to which the variable attenuator 22 is set is compared with that which was previously recorded, and the difference between these two values provides an indication of the amount of attentuation introduced by the material specimen in the holder 16. The variable attenuator 22 is preferably calibrated in units of decibels, to thereby provide a direct indication of the shielding effectiveness of the material in the holder 16.

Figure 2:
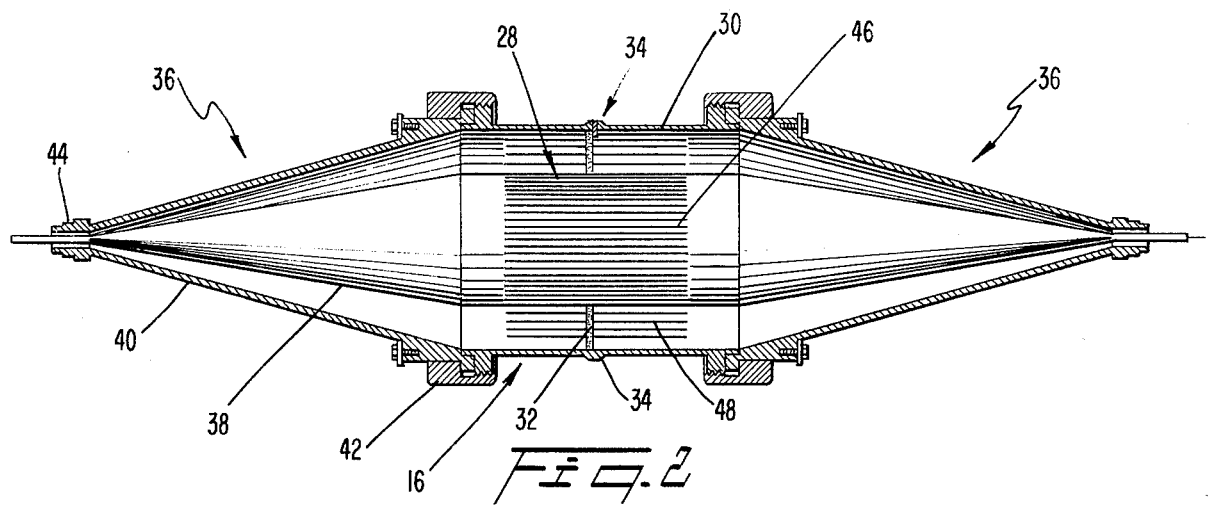
FIG. 2 is a cross-sectional view of the preferred embodiment of a material specimen holder constructed in accordance with the present invention.

Referring now to FIG. 2, a specimen holder for placing a material to be tested in shunt across the conductors of a coaxial cable is illustrated. The specimen holder includes an inner tubular conductor 28 and an outer tubular conductor 30 radially spaced from the inner conductor 28 and coaxial therewith. The inner and outer conductors 28, 30 are adapted to provide good physical and electrical contact with the inner and outer edges, respectively, of an annular specimen 32 of the material to be tested. In order to provide for accurate positioning of the specimen 32 within the holder, a stop comprised of a number of circumferentially spaced radially inwardly projecting abutments or pins 34 can be located around the inner periphery of the outer conductor 30 within a radially thicker section 35 provided on the outer conductor for the purpose of mounting the pins 34. When the specimen 32 is placed in the holder 16, it is pushed axially along the inner and outer conductors 28, 30 until it comes into contact with the pins 34, to thereby insure accurate positioning of the specimen within the holder and good electrical contact between the specimen and the inner and outer conductors 28, 30.

The specimen 32 can be substantially larger than a conventional coaxial cable. For example, the specimen can have an outside diameter of 4 inches and an inside diameter of 1.738 inches, while the outside diameter of the coaxial cable may only be ½ inch. In order to provide for a smooth transition between the conventional coaxial cable and the specimen, the specimen holder 16 includes tapered transition members 36 connected between each end of the inner and outer conductors 28, 30 and the conductors of the coaxial cable, respectively. The transition members 36 include a tapered inner conductor 38 and a tapered outer conductor 40. By tapering the conductors in the transition members 36 rather than providing a step type of connector, undesirable reflections of the signal transmitted by the coaxial cable can be avoided. The degree of taper of the inner and outer conductors 38, 40 of the transition member 36 should be such that the ratio of the diameters of the two conductors is held constant throughout the length of the transition member 36. Likewise, the ratio of the inner conductor 28 to the outer conductor 30 of the specimen holder should be the same as the ratio of the diameters of the two conductors of the coaxial cable to which the holder 16 is to be connected.

The transition members 36 can be physically attached to the conductors 28, 30 of the specimen holder by means of a collar 42. The conductors of the specimen holder 16 and the transition members 36 are designed in a well-known manner to achieve good electrical contact between them. The narrow end of each transition member 36 can include a suitable conventional coaxial fitting device 44 for connection to a standard coaxial line. The collar 42 provides for easy insertion and removal of the specimen 32 from the specimen holder 16 without the need for disconnecting the holder 16 from the measurement circuit.

As discussed previously, it is not economically feasible to machine the inside and outside diameters of the material specimen 32 within such precise tolerance ranges as would be necessary to obtain a proper fit between the tubular walls of the specimen holder 16 and the specimen itself. In order to overcome this problem, the walls of the inner and outer conductors 28, 30 of the specimen holder 16 are made flexible in radial direction to thereby enable specimens having a small range of diameter differences to come into good electrical contact with the conductors of a coaxial cable.

Figure 3:
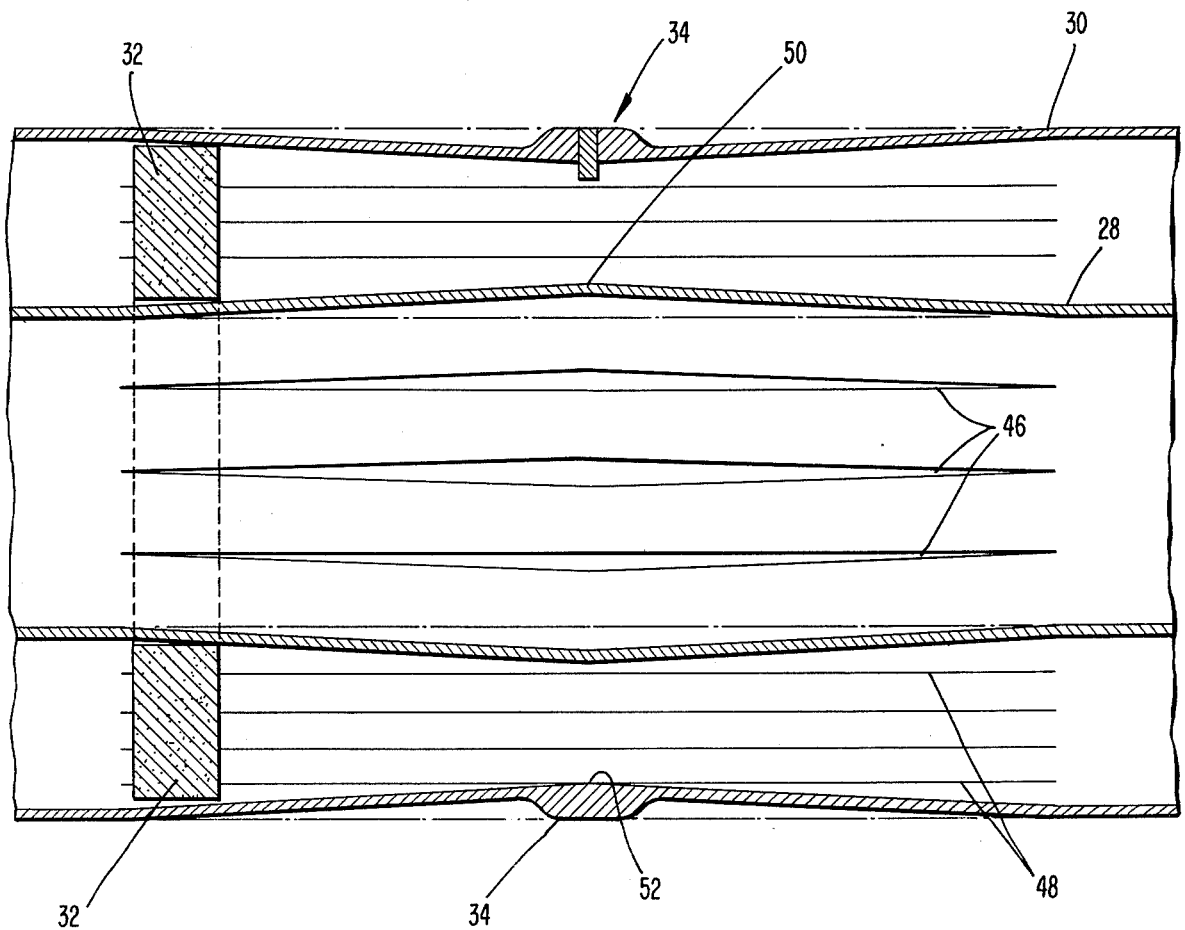
FIG. 3 is an enlarged cross-sectional view illustrating the conductors of the specimen holder of FIG. 2.

Referring now to FIG. 3, the walls of the specimen holder conductors 28 and 30 can be made flexible by providing a plurality of circumferentially spaced longitudinal slots 46, 48 in the inner and outer conductors 28, 30, respectively. These slots are preferably shorter than the total length of the conductors 28, 30 to provide mechanical strength to the conductors. The strips of material remaining after the slots are cut are laterally unsupported and therefore capable of flexing in a radial direction. The strips can be permanently distorted in a radial direction towards each other approximately at the center thereof. Thus, the strips forming the inner conductor 28 are bent outwardly at 50 to increase the diameter of the inner conductor 28 in the area of the distortion. Likewise, the strips forming the outer conductor 30 are bent inwardly at 52 to decrease the diameter of the outer conductor 30 in the area of the distortion.

The longitudinal slots in the conductors and the distortion thereof provides a spring-like quality to the walls of the tubular conductors urging them towards one another. As can be seen from FIG. 3, when a material specimen 32 is slid into the specimen holder 16 until it abuts the pins 34, the inner and outer conductors 28, 30 will be flexible enough to engage the inner and outer edges, respectively, of the material specimen and provide good electrical contact therewith. The longitudinal slots in the conductors of the specimen holder are parallel to the flow of current in the coaxial line and therefore do not result in impedance changes in the line. Furthermore, they do not permit radiation to be emitted from the line.

In a specific example of a specimen holder constructed in accordance with the present invention, the inner conductor has a diameter of 1.738 inches and the outer conductor has a diameter of 4 inches. Ninety slots having a width of 0.020 inch and a length of 3 inches are circumferentially spaced around the outer conductor, leaving strips approximately ⅛ inch wide. Similar slots are cut through the wall of the inner conductor. The strips of the outer conductor are distorted inwardly about 0.005 inch to thereby decrease the diameter of the conductor 0.010 inch in the area of the distortion. The strips of the inner conductor are likewise distorted outwardly 0.005 inch to thereby increase the diameter of the conductor 0.010 inch in the area of the distortion. It can be seen that such a holder will accommodate specimens having variations up to 0.01 inch in each of their inner and outer diameters and still maintain good electrical contact therewith. A tolerance of 0.01 inch can be easily attained when machining specimens. The tolerance range provided by the specimen holder is also sufficient to accommodate conductive silver paint which is often applied to the edges of specimens to improve electrical continuity and which can vary in thickness between 0.001 and 0.003 inch.

From the foregoing, it will appreciated that the present invention provides a novel method and apparatus for holding a specimen of a material to be tested for its electrical properties in good electrical contact with the conductors of a coaxial cable. The flexible walls of the specimen holder provide an acceptable tolerance in the size of the specimen, which can be easily and economically attained by modern practices. The longitudinal slots in the conductor which render the specimen holder walls flexible do not interfere with the signal passing through the specimen holder, and the tapered connecting portions between the specimen holder conductors and the coaxial cable prevent unwanted signal reflections which may effect the accuracy of the measurement obtained.

The present invention may be embodied in other specific forms without departing from the spirit or essential characteristics thereof. The presently disclosed embodiment is therefore considered in all respects as illustrative and not restrictive. The scope of the invention is indicated by the appended claims rather than the foregoing description, and all changes which come within the meaning and range of equivalency of the claims are therefore intended to be embraced therein.

What is claimed is:

1. Apparatus for holding a specimen of material in electrical contact with the conductors of a coaxial electrical cable, comprising:
   a first tubular conductor having a pair of longitudinal slots establishing a radially flexible strip in the wall of said first conductor, to thereby enable said first conductor to establish electrical contact with the inner surface of an annular specimen;
   a second tubular conductor larger in diameter than said first conductor and coaxial therewith, said second conductor having a pair of longitudinal slots establishing a radially flexible strip in the wall of said second conductor, to thereby enable said second conductor to establish electrical contact with the peripheral surface of an annular specimen; and
   means for providing electrical connection between said first and second conductors and the inner and outer conductors of a coaxial electrical cable, respectively.

2. The apparatus of claim 1 wherein the flexible strip in the wall of said first conductor is distorted in a radially outward direction, thereby increasing the diameter of said first conductor in the area of said distortion and urging said first conductor into contact with the inner surface of an annular specimen.

3. The apparatus of claim 1 wherein the flexible strip in the wall of said second conductor is distorted in a radially inward direction to thereby decrease the diameter of said second conductor in the area of said distortion and urge said second conductor into contact with the peripheral surface of an annular specimen.

4. The apparatus of claim 1 wherein a multiplicity of longitudinal slots having lengths less than the length of said conductors are spaced circumferentially around each of said first and second conductors to thereby provide a plurality of flexible strips in each of said first and second conductors.

5. The apparatus of claim 1 wherein said first and second conductors have diameters greater than the respective diameters of a coaxial cable to which they are to be connected, and said electrical connection means includes a first tapered conductor for connecting said first tubular conductor to the inner conductor of a coaxial cable and a second tapered conductor, coaxial with said first tapered conductor, for connecting said second tubular conductor to the outer conductor of a coaxial cable.

6. The apparatus of claim 5 wherein said first and second tapered conductors are tapered such that the ratio of the diameters of said first and second tapered conductors is maintained constant throughout the length of said first and second tapered conductors.

7. Apparatus for holding an annular specimen of material in electrical contact with the conductors of a coaxial electrical cable in a circuit for measuring the electromagnetic shielding effectiveness of the material, comprising:
   a first tubular conductor having a plurality of circumferentially spaced longitudinal slots providing a plurality of radially flexible strips, said tubular conductor being distorted in a radially outward direction in the area of said slots;
   a second tubular conductor having a diameter greater than said first conductor and being coaxial therewith, said second conductor having a plurality of circumferentially spaced longitudinal slots providing a plurality of radially flexible strips and being distorted radially inward in the area of said slots; and
   means for providing electrical connection between said first and second conductors and the inner and outer conductors of a coaxial electrical cable, respectively.

8. The apparatus of claim 7 wherein said first and second conductors have diameters greater than the respective diameters of a coaxial cable to which they are to be connected, and said electrical connection means includes a first tapered conductor for connecting said first tubular conductor to the inner conductor of a coaxial cable and a second tapered conductor, concentric with said first tapered conductor, for connecting said second tubular conductor to the outer conductor of a coaxial cable.

9. The apparatus of claim 8 wherein said first and second tapered conductors are tapered such that the ratio of the diameters of said first and second tapered conductors is maintained constant throughout the length of said first and second tapered conductors.

10. A method for establishing electrical contact between an annular material specimen and an electrical apparatus, comprising the steps of:
    providing longitudinal slots in each of two radially spaced coaxial conductors to establish radially flexible strips in the walls of said conductors flexible in a radial direction;

distorting the flexible strips of said conductors in a radial direction towards one another;

inserting an annular specimen in the space between said conductors such that the inner surface of the specimen is in contact with the inner conductor and the peripheral surface of the specimen is in contact with the outer conductor; and establishing electrical connection between the coaxial conductors and an electrical apparatus.

11. A method for measuring the electromagnetic shielding effectiveness of a material, comprising the steps of:

providing longitudinal slots in each of two radially spaced coaxial conductors to establish radially flexible strips in the walls of said conductors;

inserting an annular specimen of the material in the space between said conductors;

urging the walls of said conductors into physical contact with the inner and outer circumferential surfaces of the specimen;

providing an electrical signal at one end of said conductors;

measuring the strength of said electrical signal at the other end of said conductors; and comparing the strength of the two electrical signals.

12. The method of claim 11 wherein said step of urging includes permanently distorting the flexible strips of said conductors in a radial direction towards each other.

* * * * *